United States Patent
Lin

(10) Patent No.: US 10,741,783 B2
(45) Date of Patent: Aug. 11, 2020

(54) LIGHT EMITTING DEVICE AND MANUFACTURING METHOD FOR THE SAME

(71) Applicant: Wuhan China Star Optoelectronics Semiconductor Display Technology Co., Ltd., Wuhan (CN)

(72) Inventor: Min Lin, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 72 days.

(21) Appl. No.: 16/109,812

(22) Filed: Aug. 23, 2018

(65) Prior Publication Data
US 2019/0229286 A1 Jul. 25, 2019

Related U.S. Application Data

(63) Continuation of application No. PCT/CN2018/077115, filed on Feb. 24, 2018.

(30) Foreign Application Priority Data

Jan. 25, 2018 (CN) .......................... 2018 1 0075220

(51) Int. Cl.
*H01L 51/52* (2006.01)
*H01L 51/56* (2006.01)
(Continued)

(52) U.S. Cl.
CPC ........ *H01L 51/5206* (2013.01); *C23C 14/086* (2013.01); *C23C 14/16* (2013.01);
(Continued)

(58) Field of Classification Search
CPC ............. H01L 51/5215; H01L 51/5218; H01L 51/0021; H01L 33/36; H01L 33/38;
(Continued)

(56) References Cited

U.S. PATENT DOCUMENTS 6,106,689 A * 8/2000 Matsuyama ............ C23C 18/52
205/164
7,309,405 B2 * 12/2007 Cho ....................... C23C 14/086
204/192.11
(Continued)

FOREIGN PATENT DOCUMENTS

| CN | 102195006 A | 9/2011 |
|---|---|---|
| CN | 102891265 A | 1/2013 |
| CN | 102956836 A | 3/2013 |

OTHER PUBLICATIONS

Y. Sato et al., Sputter deposition of Al-doped ZnO films with various incident angles, J. Vacuum Science & Technology, (Jul. 31, 2009), vol. 27, No. 5, pp. 1166-1171. (Year: 2009).*
(Continued)

*Primary Examiner* — Victoria K. Hall

(57) ABSTRACT

The present application provides a light emitting device and a manufacturing method for the same. The light emitting device includes a substrate and an anode structure disposed on the substrate, which is formed by depositing particles on a surface of the substrate through a deposition source. During the process of the anode structure, the substrate is disposed obliquely with respect to the deposition source such that the particles of the functional film layers of the anode structure are arranged in a fixed direction, thereby increasing the work function of the anode structure.

19 Claims, 4 Drawing Sheets

(51) Int. Cl.
*H01L 51/00* (2006.01)
*C23C 14/08* (2006.01)
*C23C 14/14* (2006.01)
*C23C 14/34* (2006.01)
*C23C 14/22* (2006.01)
*C23C 14/54* (2006.01)
*C23C 14/16* (2006.01)

(52) U.S. Cl.
CPC ............ *C23C 14/226* (2013.01); *C23C 14/34* (2013.01); *C23C 14/54* (2013.01); *H01L 51/0012* (2013.01); *H01L 51/0021* (2013.01); *H01L 51/5215* (2013.01); *H01L 51/5218* (2013.01); *H01L 51/5253* (2013.01); *H01L 51/56* (2013.01); *H01L 51/5256* (2013.01); *H01L 2251/305* (2013.01); *H01L 2251/5369* (2013.01)

(58) Field of Classification Search
CPC ....... H01L 33/40; H01L 33/405; H01L 33/42; H01L 51/0012; C23C 14/225; C23C 14/226
See application file for complete search history.

(56) References Cited

U.S. PATENT DOCUMENTS

| | | | | |
|---|---|---|---|---|
| 9,688,570 | B2* | 6/2017 | Agnello | C03C 17/007 |
| 2001/0015319 | A1* | 8/2001 | Choe | C23C 14/086 |
| | | | | 204/408 |
| 2005/0059186 | A1* | 3/2005 | Kelly | C25B 1/003 |
| | | | | 438/73 |
| 2008/0296600 | A1 | 12/2008 | Kwack et al. | |
| 2010/0207149 | A1* | 8/2010 | Kim | H01L 51/5271 |
| | | | | 257/98 |
| 2012/0223302 | A1* | 9/2012 | Yukinobu | C09D 1/00 |
| | | | | 257/43 |
| 2012/0313055 | A1* | 12/2012 | Yukinobu | C23C 18/1275 |
| | | | | 252/519.5 |
| 2016/0024678 | A1* | 1/2016 | Chen | C25D 3/48 |
| | | | | 428/672 |
| 2016/0254761 | A1* | 9/2016 | Furukawa | H02M 7/537 |
| | | | | 363/131 |
| 2018/0159060 | A1 | 6/2018 | Verilhac et al. | |
| 2019/0013497 | A1* | 1/2019 | So | H01L 51/5275 |
| 2019/0035939 | A1* | 1/2019 | Yamazaki | H01L 21/02565 |
| 2020/0013990 | A1* | 1/2020 | Ueda | H01L 51/5271 |
| 2020/0075864 | A1* | 3/2020 | Helander | H01L 51/0023 |
| 2020/0087777 | A1* | 3/2020 | Nishiguchi | H01L 51/56 |

OTHER PUBLICATIONS

S. Fernández et al., Tailoring of microstructure and optoelectronic properties of Aluminum doped Zinc Oxide changing gun tilt, Materials Science in Semiconductor Processing (Feb. 17, 2017), vol. 63, pp. 115-121. (Year: 2017).*

X. Xiao et al., Optical and electrical properties of SnO2:Sb thin films deposited by oblique angle deposition, Applied Surface Science (Oct. 2, 2009), vol. 256, pp. 1636-1640. (Year: 2009).*

B. C. Mohanty et al., Spatial Variation in Structural, Morphological and Optical Properties of Aluminum-Doped ZnO Thin Films Grown by 30°—Incident Radio Frequency Magnetron Sputtering, J. Electrochemical Soc., (Dec. 21, 2010), vol. 158, No. 2, pp. P30-P35. (Year: 2010).*

D Toledano et al., Compositional and structural properties of nanostructured ZnO thin films grown by oblique angle reactive sputtering deposition: effect on the refractive index, J. Physics D, (Dec. 17, 2012), vol. 46, No. 045395, pp. 1-7. (Year: 2012).*

P. Nuchuay et al., Preparation and Characterization of ITO Nanostructure by Oblique Angle Deposition, Materials Today: Proceedings, 2017, vol. 4, pp. 6284-6288. (Year: 2017).*

Y. Yamada et al., Positional variation and annealing effect in magnetron sputtered Ga-doped ZnO films, Thin Solid Films, (Apr. 26, 2016), vol. 609, pp. 25-29. (Year: 2016).*

Lan Feng et al, Low Temperature Deposition of ZnO:Al Thin Films by Inclined Magnetron Sputtering and Their Photoelectric Properties, Functional Materials, 2010, pp. 304-307, China.

* cited by examiner

LIGHT EMITTING DEVICE AND MANUFACTURING METHOD FOR THE SAME

CROSS-REFERENCE TO RELATED APPLICATIONS

The present application is a continuation-application of International (PCT) Patent Application No. PCT/CN2018/077115 filed on Feb. 24, 2018, which claims foreign priority of Chinese Patent Application No. 201810075220.9, filed on Jan. 25, 2018 in the State Intellectual Property Office of China, the entire contents of which are hereby incorporated by reference.

TECHNICAL FIELD

The present discourse relates to the field of display technologies, and in particular, to a light emitting device and a manufacturing method for the same.

BACKGROUND

The organic light emitting diode generally includes an anode, a cathode, and an organic material functional layer, which is sandwiched between the two electrodes with a single layer or a multilayer structure. The organic material functional layers may have different kinds of structures.

In general, indium tin oxide (ITO) in organic light emitting diodes is the most commonly used conductive oxide, however ITO is expensive to manufacture and toxic. The aluminum-doped zinc oxide (AZO) has the characteristics of low cost, high band gap, non-toxicity, and high transparency, which is considered as the substitute for ITO more likely. Especially in the era of rapid development of display technology, the demand for conductive oxides for electrodes has become much higher, and the development of low-cost, clean-type display technology has also become an urgent need for social development.

At present, an AZO/Ag/AZO electrode structure is proposed to provide a realistic basis for replacing the classic ITO/Ag/ITO structure. At the same time, the AZO/Ag/AZO electrode structure has low resistivity and high light transmittance and can also be applied to the flexible display field. However, a method for manufacturing AZO/Ag/AZO electrodes with low resistance, high carrier mobility and high transmittance has not been proposed from the prior art, so this problem needs to be solved in the industry.

SUMMARY

The technical problem to be solved by the present disclosure is to provide a light emitting device and a manufacturing method for the same, which may increase the transmittance and the work function of anode structure of the light emitting device.

To address the technical problem above, a technical solution adopted by the present disclosure is:
a light emitting device, including:
a substrate having a surface; and
an anode structure disposed on the substrate and comprising a plurality of particles having a preferred orientation along the same direction on the surface of the substrate to from a first conductive layer, a metal layer and a second conductive layer; and
a light emitting layer, a cathode structure, a first inorganic layer, a cathode structure, a first organic layer, a second inorganic layer which may be sequentially and stackedly arranged on the anode structure.

To solve the above technical problems, another technical solution adopted by the present disclosure is:
a light emitting device, including:
a substrate;
an anode structure consisting of a plurality of particles having a preferred orientation along the same direction on the surface of the substrate to from a first conductive layer, a metal layer and a second conductive layer;
a light emitting layer on the second conductive layer; and
a cathode structure disposed on the anode structure.

To solve the above problems, another technical solution adopted by the present disclosure is:
a manufacturing method for a light emitting device, comprising:
providing a substrate and a deposition source having particles to form functional film layers on a surface of the substrate;
disposing the substrate obliquely with respect to the deposition source and forming a first conductive layer on the substrate by the deposition source;
disposing a metal layer on the first conductive layer by the deposition source; and
disposing a second conductive layer on the metal layer by the deposition source.

The present application may have the following beneficial effect: the present disclosure may provide a light emitting device and a manufacturing method for the same, which may include a substrate and an anode structure disposed on the substrate, and the anode structure may be formed by depositing particles on a surface of the substrate through a deposition source. In the present application, the substrate may be disposed obliquely with respect to the deposition source such that the particles forming the functional film layers of the anode structure are arranged in a fixed direction, thereby increasing the work function of the anode structure. By providing a first conductive layer on the substrate, a metal layer on the first conductive layer and a second conductive layer on the metal layer, the anode structure can improve the transmittance of the light emitting device.

BRIEF DESCRIPTION OF THE DRAWINGS

In order to make the technical solution of embodiments of the present disclosure more clearly, drawings used for the description of the embodiments will be briefly described. Apparently, the drawings described above are only some exemplary embodiments of the present disclosure. One skilled in the art may acquire other drawings based on these drawings without any inventive work. In the drawings.

DETAILED DESCRIPTION

The technical solution of the embodiments of the present disclosure will be described more clearly and completely with reference to the accompanying drawings. Apparently, the embodiments described here only some exemplary embodiments, not all the embodiments. Based on the embodiments described in the present disclosure, one skilled in the art may acquire all other embodiments without any creative work. All these shall be covered within the protection scope of the present disclosure.

Figure 1:
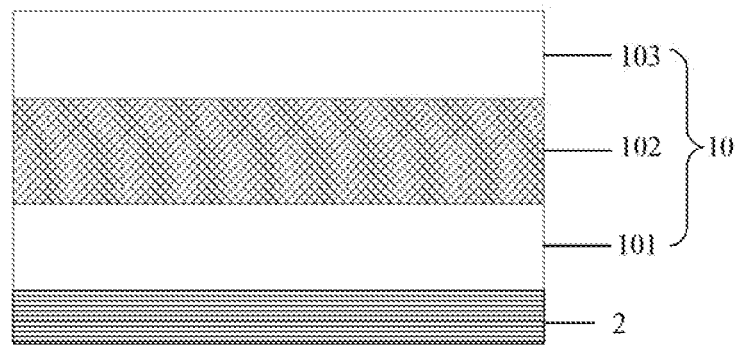
FIG. 1 is a schematic structural view of an anode structure of a light emitting device according to the present disclosure.

Please refer to FIG. 1, which is a structural schematic diagram of an anode structure of a light emitting device of the present disclosure. The light emitting device may include a substrate 2 and an anode structure 10, and the anode structure 10 may be disposed on the substrate 2. The anode structure 10 may include a first conductive layer 101, a metal layer 102 and a second conductive layer 103. Specifically, the first conductive layer 101 may be disposed on the substrate 2, and the metal layer 102 may be sandwiched between the first conductive layer 101 and the second conductive layer 103.

Figure 2:
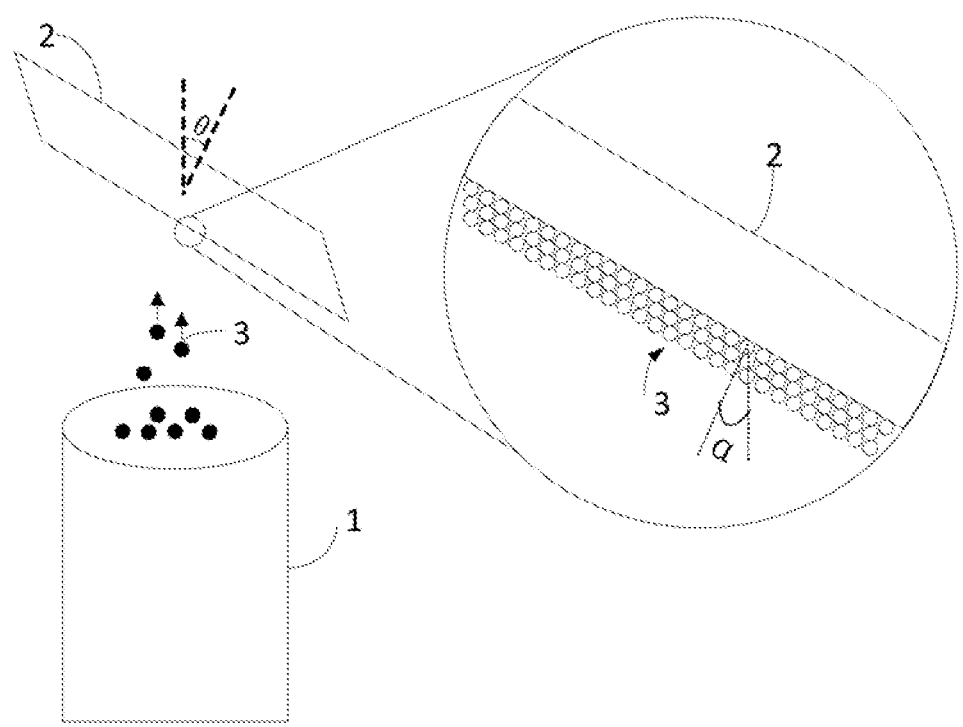
FIG. 2 is a schematic diagram of a manufacturing process of the anode structure in FIG. 1.

Referring to FIG. 2 combined with FIG. 1, FIG. 2 is a schematic diagram of a manufacturing process of the anode structure in FIG. 1. The anode structure 10 may be formed by depositing particles 3 on a surface of the substrate 2 by a deposition source 1.

In the process of the anode structure 10, an opening of the deposition source 1 may be disposed vertically upward, the substrate 2 may be disposed above the opening in deposition direction of the particles 3, and the substrate 2 may be disposed obliquely with respect to the deposition source 1 (ie, the deposition source 1 and the substrate 2 are not perpendicular to each other). The angle θ may be formed between the normal direction of the surface of the substrate 2 and the deposition direction of the deposition source 1 and may be in the range from about 10 degrees to 80 degrees.

Further, the particles 3 in this embodiment may be deposited on a surface of the substrate 2 layer by layer in the direction in which the substrate 2 is inclined, and may form the first conductive layer 101, the metal layer 102 and the second conductive layer 103 finally.

Specifically, in a partially enlarged view of FIG. 2, the particles 2 are deposited layer by layer in the vertical direction on the inclined substrate surface 2. The angle α between a direction in which the particles are stacked and a plane normal direction of the substrate may be equal to θ. Different from the substrate 2 disposed horizontally that the particles 2 are randomly deposited on the surface of the substrate 2, the particles 3 in this embodiment of the respective functional film layers deposited on the surface of the substrate 2 may be aligned along a fixed direction, thereby improving the transmittance and the work function of the anode structure 10.

Furthermore, the deposition source 1 may deposit the particles 3 onto a surface of the substrate 2 by a sputtering deposition method to form a first conductive layer 101 having a thickness of 10 nm to 100 nm. In one embodiment, a metal layer 102 having a thickness of 5 nm to 20 nm may be formed on the first conductive layer 101 by a physical vapor deposition method. A second conductive layer 103 having a thickness of 10 nm to 100 nm may be formed on the metal layer 102 by a sputtering deposition method.

In some embodiments, the material of the particles 3 can be selected according to the needs of the individual functional layers. Specifically, in one embodiment, the materials of the first conductive layer 101 and the second conductive layer 103 may be aluminum doped zinc oxide (AZO), and the metal layer 102 material may be at least one of silver (of Ag), aluminum (Al) and gold (Au).

Figure 3:
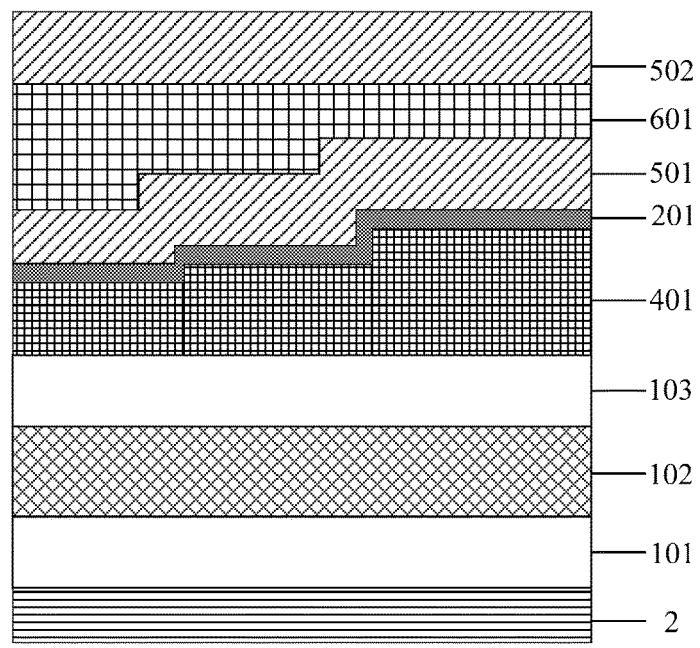
FIG. 3 is a schematic structural view of one embodiment of the light emitting device according to the present disclosure.

Referring to FIG. 3, which is a schematic structural view of one embodiment of the light emitting device according to the present disclosure. The light emitting device may include a substrate 2, a first conductive layer 101, a metal layer 102, a second conductive layer 103, a light emitting layer 401, a cathode structure 201, a first inorganic layer 501, an organic layer 601 and a second inorganic layer 502, which may be sequentially and stackedly arranged on the substrate 2.

Specifically, the first inorganic layer 501 with a thickness of 1 μm to 10 μm may be formed on the light emitting layer 401 and the cathode structure 201 using a plasma enhanced chemical vapor deposition method. The material of the first inorganic layer 501 may be at least one of aluminum oxide ($Al_2O_3$), zirconium oxide ($ZrO_2$), hafnium oxide ($HfO_2$), silicon nitride ($SiN_x$), silicon oxide ($SiO_x$), Silicon Nitride ($SiON_x$) and Silicon Carbide ($SiCN_x$).

A first organic layer 601 with a thickness of 1 μm to 10 μm may be deposited on the first inorganic layer 501 by a plasma enhanced chemical vapor deposition process. The material of the first organic layer 601 may include, but be not limited to, acrylic, poly Styrene, polyester, etc. The first organic layer 601 may be used to buffer the stress experienced by the light emitting device during bending and folding, and also prevent deposition of particulate contaminants from covering the first inorganic layer 501. A second inorganic layer 502 may be formed on the surface of the first organic layer 601, and the material and thickness of the second inorganic layer 502 may be the same as those of the first inorganic layer 501.

Figure 4:
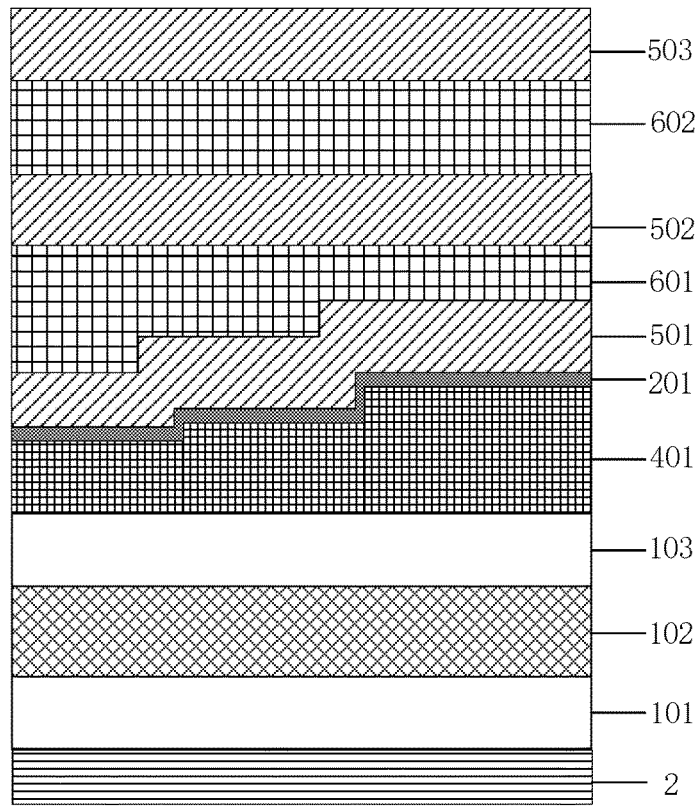
FIG. 4 is a block diagram of another embodiment of the light emitting device of the present disclosure.

Referring to FIG. 4, which is a schematic structural view of one embodiment of the light emitting device according to the present disclosure. The difference between this embodiment of the light emitting device and the above embodiment may be that the light emitting device may further include a second organic layer 602 disposed on the second inorganic layer 502 and a third inorganic layer 503 disposed on the second organic layer 602. By providing the second organic layer 602 and the third inorganic layer 503, the light emitting layer can be better protected, thereby increasing the life of the light emitting device.

Specifically, the second organic layer 602 may be formed on the second inorganic layer 502, and the third inorganic layer 503 may be formed on the second organic layer 602. The process, material and thickness of the third inorganic layer 503 may be the same as those of the first inorganic layer 501 and the second inorganic layer 502. The process, material and thickness of the second organic layer 602 may be the same as those of the first organic layer 601.

Figure 5:
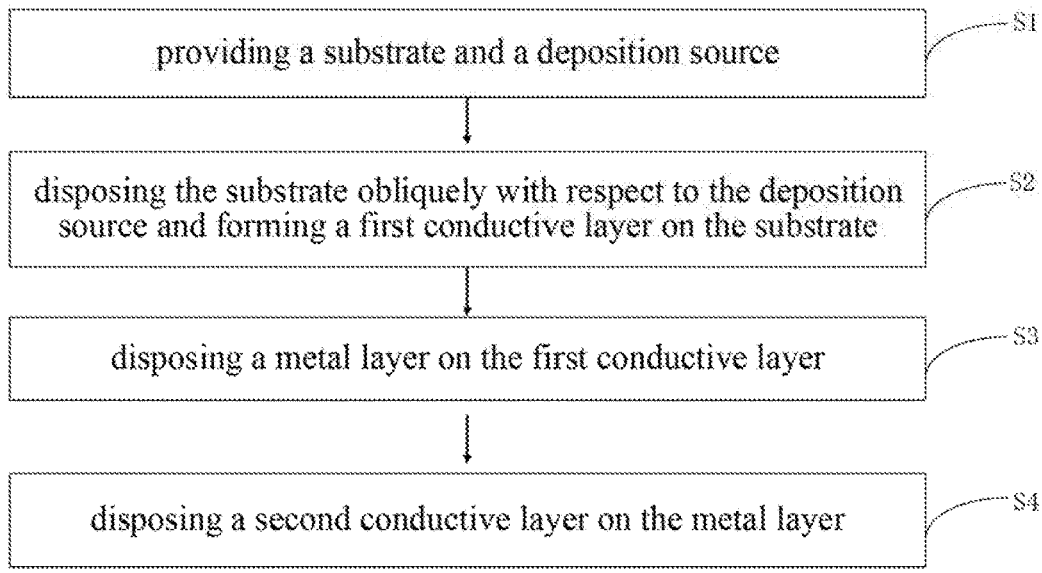
FIG. 5 to FIG. 7 are schematic flow diagrams of a method for manufacturing a light emitting device according to the present disclosure.

Please referring to FIG. 5 and FIG. 2, which is a schematic flowchart of a method for manufacturing a light emitting device according to the present disclosure. In this embodiment, the method may include the following blocks.

S1: providing a substrate 2 and a deposition source 1.

Specifically, the substrate 2 may be a glass substrate. The deposition source 1 stores particles 3 which can be deposited on a surface of the substrate 2 by the deposition source 1 to form respective functional film layers.

S2: disposing the substrate 2 obliquely with respect to the deposition source 2 and forming a first conductive layer 101 on the substrate 2 by the deposition source 1.

Specifically, the deposition source 1 may form a first conductive layer 101 on the substrate 2 by a method of sputter deposition. The material of the first conductive layer 101 may be aluminum-doped zinc oxide (AZO), the thickness of which may be in the range from 10 nm to 100 nm. An angle may be formed between a normal direction of the surface of the substrate 2 and a deposition direction of the deposition source 1, and the angle θ may in the range from 10 to 80 degrees.

S3: disposing a metal layer 102 on the first conductive layer 101 by the deposition source.

Specifically, the deposition source 1 may form a metal layer 102 on the surface of the first conductive layer 101 by physical vapor deposition, and the material of the metal layer 102 having a thickness of 5 nm to 20 nm may be at least one of silver (Ag), aluminum (Al), and gold (Au).

S4: disposing a second conductive layer 103 on the metal layer 102 by the deposition source.

Specifically, the deposition source 1 may form a second conductive layer 103 on a surface of the metal layer 102 by a method of sputter deposition, and the material of the second conductive layer 103 with the thickness thereof is 10 nm to 100 nm may be aluminum-doped zinc oxide (AZO).

Figure 6:
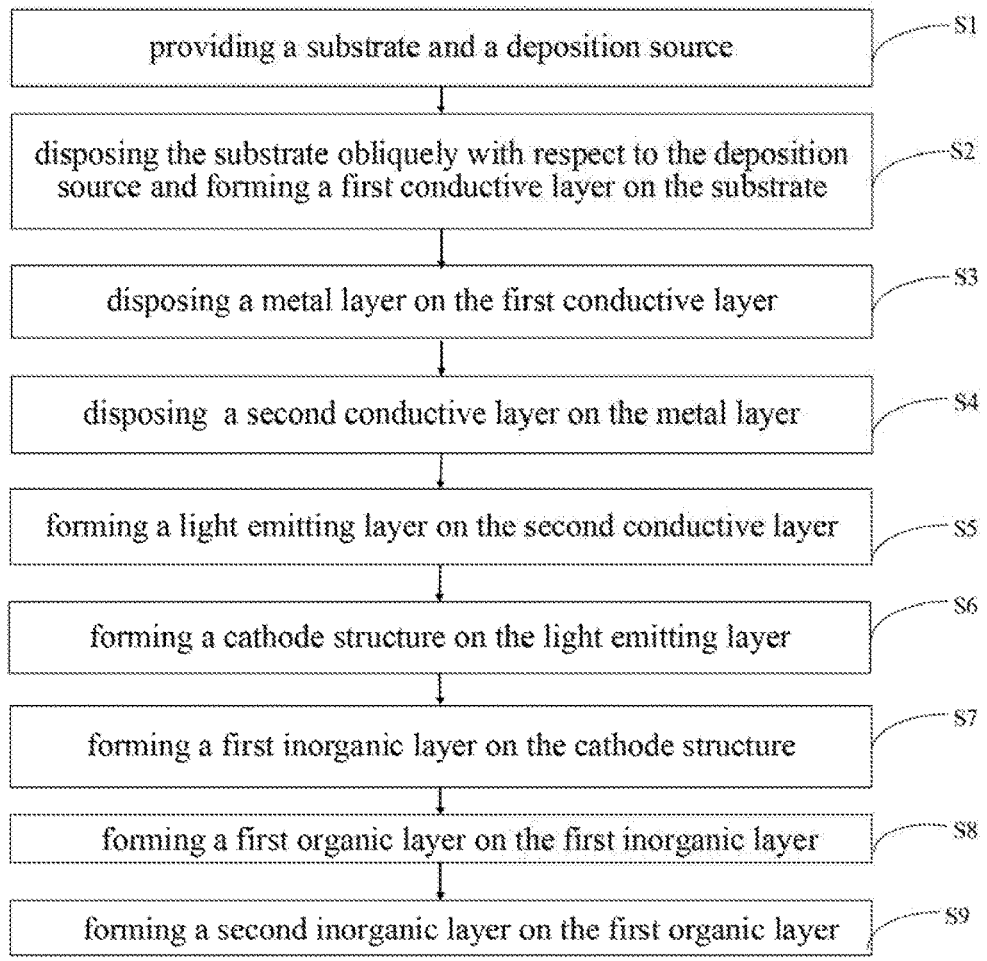

Referring to FIG. 6, in this embodiment, the method may further include the following blocks.

S5: forming a light emitting layer 401 on the second conductive layer 103.

S6: forming a cathode structure 201 on the light emitting layer 401.

S7: forming a first inorganic layer 501 on the cathode structure.

S8: forming a first organic layer 601 on the first inorganic layer 501.

S9: forming a second inorganic layer 502 on the first organic layer 601.

Specifically, the first inorganic layer 501, the first organic layer 601 and the second inorganic layer 502 may have a thickness of 1 μm to 10 μm.

Specifically, the material of the first inorganic layer 501 may be at least one of aluminum oxide ($Al_2O_3$), zirconium oxide ($ZrO_2$), hafnium oxide ($HfO_2$), silicon nitride ($SiN_x$), silicon oxide ($SiO_x$), Silicon Nitride ($SiON_x$) and Silicon Carbide ($SiCN_x$). The first organic layer 601 may be used to buffer the stress experienced by the light emitting device during bending and folding, and also prevent deposition of particulate contaminants from covering the first inorganic layer 501.

Figure 7:
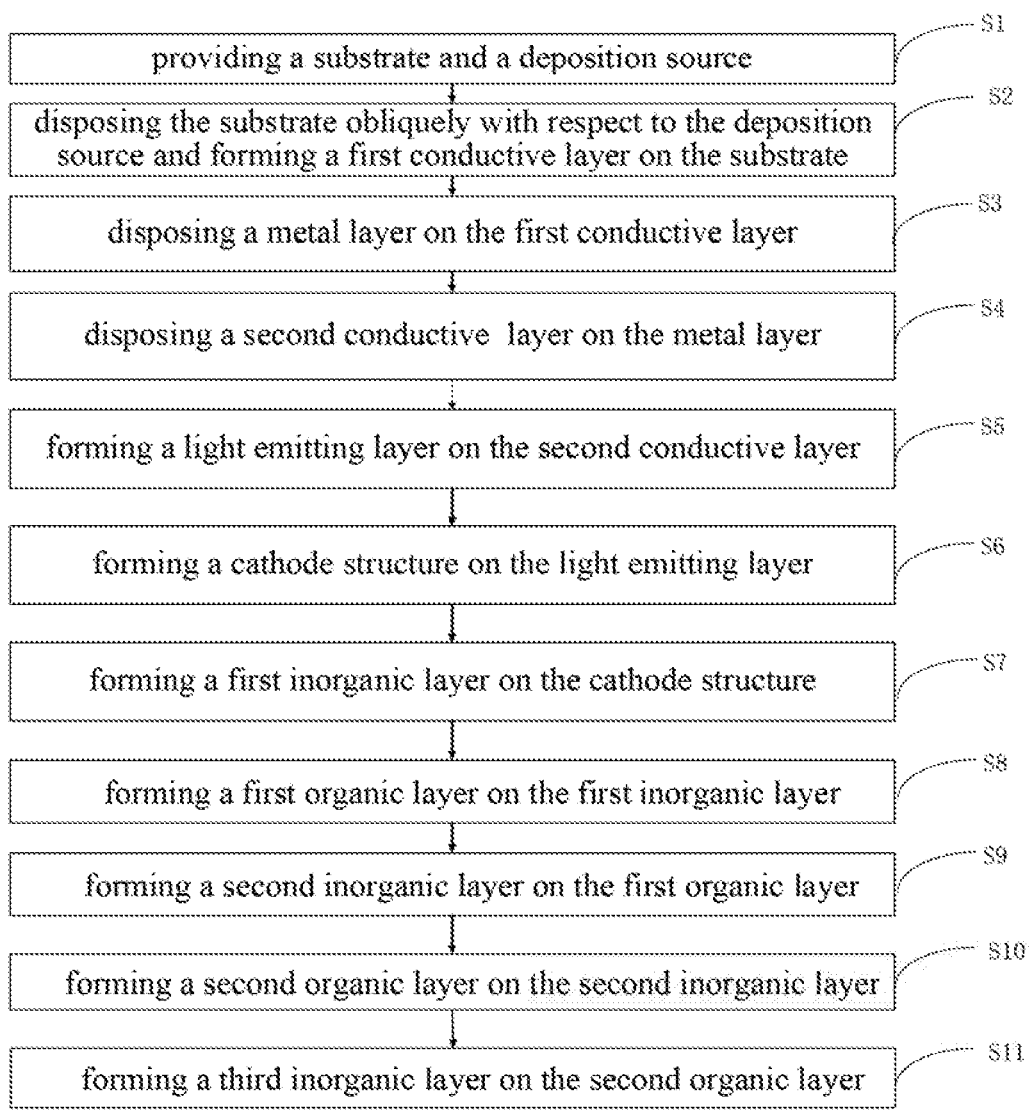

Referring to FIG. 7, in this embodiment, the method may further include the following blocks.

S10: forming a second organic layer 602 on the second inorganic layer 502.

S11: forming a third inorganic layer 503 on the second organic layer 602.

The process, material and thickness of the second organic layer 602 may be the same as those of the first organic layer 601, and the process, material and thickness of the third inorganic layer 503 may be the same as the first inorganic layer 501 and the second inorganic layer 502.

The present application may provide a light emitting device and a manufacturing method for the same. The light emitting device may include a substrate and an anode structure disposed on the substrate. By disposing the substrate obliquely with respect to the deposition source, particles of the functional film layers of the anode structure formed on the surface of the substrate are arranged along a fixed direction, thereby increasing the work function of the anode structure. The anode structure may further include a first conductive layer disposed on the substrate, a metal layer disposed on the first conductive layer, and a second conductive layer disposed on the metal layer, thereby improving transmission of the anode structure of the light emitting device. By disposing a first organic layer, a second organic layer, a first inorganic layer, a second inorganic layer and a third inorganic layer sequentially on the anode structure, the sealing property of the light emitting device can be improved, thereby prolonging the service life of the light emitting device.

The descriptions above are merely the embodiments of the present disclosure and are not intended to limit the protection scope of the present disclosure. In fact, one skilled in the art may make many equivalents and modifications based on the specification and the drawings of the present disclosure, or directly or indirectly apply the technical solution to other relevant technical field. All these shall all be covered within the protection of the disclosure.

What is claimed is:

1. A light emitting device, comprising:
   a substrate having a surface; and
   an anode structure disposed on the substrate and comprising a plurality of particles having a preferred orientation along the same direction on the surface of the substrate to form a first conductive layer, a metal layer and a second conductive layer; and
   a light emitting layer, a cathode structure, a first inorganic layer, a first organic layer, a second inorganic layer which are sequentially and stackedly arranged on the anode structure.

2. A light emitting device, comprising:
   a substrate having a surface;
   an anode structure consisting of a plurality of particles having a preferred orientation along the same direction on the surface of the substrate to form a first conductive layer, a metal layer and a second conductive layer;
   a light emitting layer on the second conductive layer; and
   a cathode structure disposed on the light emitting layer.

3. The light emitting device according to claim 2, wherein the anode structure comprises:
   a first conductive layer disposed on the substrate;
   a metal layer disposed on the first conductive layer; and
   a second conductive layer on the metal layer such that the metal layer is sandwiched between the first and second conductive layers;
   wherein each of the first conductive layer, the metal layer and the second conductive layer consists of the particles.

4. The light emitting device according to claim 3, wherein, the material of the first conductive layer and the second conductive layer is aluminum-doped zinc dioxide.

5. The light emitting device according to claim 3, wherein the first conductive layer and the second conductive layer each has a thickness of 10 nm to 100 nm.

6. The light emitting device according to claim 3, wherein the material of the metal layer is at least one of silver, aluminum, and gold.

7. The light emitting device according to claim 4, wherein the metal layer has a thickness of 5 nm to 20 nm.

8. The light emitting device according to claim 3, further comprising
   a first inorganic layer disposed on the cathode structure;
   a first organic layer disposed on the first inorganic layer; and
   a second inorganic layer disposed on the first organic layer.

9. The light emitting device according to claim 8, wherein, the material of the first organic layer is at least one of acrylic, polystyrene, and polyester.

10. The light emitting device according to claim 8, wherein, the first organic layer has a thickness of 1 μm to 10 μm.

11. The light emitting device according to claim 8, wherein, the material of the first inorganic layer and the second inorganic layer is at least one of aluminum oxide, zirconium dioxide, hafnium oxide, silicon nitride, silicon oxide, silicon oxynitride and silicon carbide.

12. The light emitting device according to claim 8, wherein, the first inorganic layer and the second inorganic layer each has a thickness ranging from 1 μm to 10 μm.

13. The light emitting device according to claim 8, further comprising a second organic layer disposed on the second inorganic layer and a third inorganic layer disposed on the second organic layer.

14. The light emitting device according to claim 13, wherein, a material of the second organic layer is at least one of acrylic, polystyrene, and polyester; wherein a thickness of the second organic layer is at a range of about 1 μm to 10 μm.

15. The light emitting device according to claim 13, wherein a material of the third inorganic layer is at least one of aluminum oxide, zirconium dioxide, hafnium oxide, silicon nitride, silicon oxide, silicon oxynitride and silicon carbide; wherein a thickness of the third inorganic layer is at a range of about 1 μm to 10 μm.

16. A manufacturing method for a light emitting device, comprising:
  providing a substrate and a deposition source having particles to form functional film layers on a surface of the substrate;
  disposing the substrate obliquely with respect to the deposition source and forming a first conductive layer on the substrate by the deposition source;
  disposing a metal layer on the first conductive layer; and
  disposing a second conductive layer on the metal layer;
  wherein an angle with a range of 10 degrees to 80 degrees is formed between a plane normal direction of the substrate and a deposition direction of the deposition source such that the particles consisting the first conductive layer, the metal layer and the second conductive layer have a preferred orientation along the same direction on the surface of the substrate.

17. The method according to claim 16, further comprising:
  forming a light emitting layer on the second conductive layer;
  forming a cathode structure on the light emitting layer;
  forming a first inorganic layer on the cathode structure;
  forming a first organic layer on the first inorganic layer; and
  forming a second inorganic layer on the first organic layer.

18. The method according to claim 17, further comprising:
  forming a second organic layer on the second inorganic layer; and
  forming a third inorganic layer on the second organic layer.

19. The method according to claim 18, wherein, the metal layer has a thickness of 5 nm to 20 nm; and the thickness of the first conductive layer and the second conductive layer is each 10 nm to 100 nm; the first inorganic layer, the second inorganic layer, the third inorganic layer, the first organic layer and the second organic layer each has a thickness ranging from 1 μm to 10 μm.

* * * * *